United States Patent
Kinoshita et al.

(10) Patent No.: US 10,581,331 B2
(45) Date of Patent: Mar. 3, 2020

(54) POWER SOURCE APPARATUS, ELECTRONIC EQUIPMENT AND SHIP APPLICATION EXECUTION SYSTEM

(71) Applicant: Furuno Electric Co., Ltd., Hyogo (JP)

(72) Inventors: Youhei Kinoshita, Hyogo (JP); Hiroshi Yoshii, Hyogo (JP); Hiroshi Nagano, Hyogo (JP); Wenhai Liu, Hyogo (JP)

(73) Assignee: Furuno Electric Co., Ltd., Hyogo (JP)

( * ) Notice: Subject to any disclaimer, the term of this patent is extended or adjusted under 35 U.S.C. 154(b) by 0 days.

(21) Appl. No.: 16/090,592

(22) PCT Filed: Apr. 18, 2017

(86) PCT No.: PCT/JP2017/015620
§ 371 (c)(1),
(2) Date: Oct. 2, 2018

(87) PCT Pub. No.: WO2017/188069
PCT Pub. Date: Nov. 2, 2017

(65) Prior Publication Data
US 2019/0115839 A1 Apr. 18, 2019

(30) Foreign Application Priority Data
Apr. 28, 2016 (JP) .................................. 2016-091223

(51) Int. Cl.
*H02M 3/335* (2006.01)
*H02M 1/00* (2006.01)
(Continued)

(52) U.S. Cl.
CPC .. *H02M 3/33515* (2013.01); *G01R 19/16528* (2013.01); *G05F 1/462* (2013.01);
(Continued)

(58) Field of Classification Search
CPC .. H02J 7/0021; H02J 7/0026; H02J 2007/005; H02J 7/04; H02J 7/041;
(Continued)

(56) References Cited

U.S. PATENT DOCUMENTS

| | | | |
|---|---|---|---|
| 2010/0084918 A1* | 4/2010 | Fells | H02J 5/005 307/32 |
| 2013/0195497 A1* | 8/2013 | Shimura | G03G 15/80 399/88 |

(Continued)

FOREIGN PATENT DOCUMENTS

| JP | H08317645 | | 11/1996 |
|---|---|---|---|
| JP | 2000184733 | * | 6/2000 |

(Continued)

OTHER PUBLICATIONS

Machine English Translation of JP2000184733 Jun. 30, 2000.*
(Continued)

*Primary Examiner* — Jeffrey A Gblende
*Assistant Examiner* — Sisay G Tiku
(74) *Attorney, Agent, or Firm* — JCIPRNET (57) ABSTRACT

To measure with ease an input voltage from an external power source and notify the user of the input voltage, a power source apparatus comprising a power source voltage input terminal, an insulating transformer, a power source control device, and a communication unit is provided. The power source voltage input terminal is connected to an external battery. The insulating transformer has a primary coil that is connected to the power source voltage input terminal. The power source control device is connected to the power source voltage input terminal and measures the input voltage to the power source voltage input terminal.

(Continued)

The communication unit transmits the voltage value measured by a microcomputer to the secondary side of the insulating transformer.

9 Claims, 6 Drawing Sheets

(51) Int. Cl.
*G01R 19/165* (2006.01)
*G05B 19/042* (2006.01)
*G05F 1/46* (2006.01)

(52) U.S. Cl.
CPC ....... *H02M 3/335* (2013.01); *H02M 3/33507* (2013.01); *G05B 19/0421* (2013.01)

(58) Field of Classification Search
CPC ............... H02J 7/042; H02M 3/33515; H02M 3/33523; H02M 2001/0009; H02M 1/32; G01R 19/16533; G05B 19/0423; G05B 19/0425
See application file for complete search history.

(56) References Cited

U.S. PATENT DOCUMENTS

| 2016/0349814 | A1* | 12/2016 | Carpenter, Jr. | ........ G06F 13/385 |
| 2017/0077722 | A1* | 3/2017 | Jung | ..................... H02J 7/0021 |

FOREIGN PATENT DOCUMENTS

| JP | 2001275344 | | 10/2001 |
| JP | 2002300734 | | 10/2002 |
| JP | 2010005018 | * | 1/2010 |
| JP | 2015023735 | | 2/2015 |

OTHER PUBLICATIONS

Machine English Translation of JP2010005018 Jan. 14, 2010.*
"International Search Report (Form PCT/ISA/210)" of PCT/JP2017/015620, dated Jun. 13, 2017, with English translation thereof, pp. 1-4.

* cited by examiner

POWER SOURCE APPARATUS, ELECTRONIC EQUIPMENT AND SHIP APPLICATION EXECUTION SYSTEM

CROSS-REFERENCE TO RELATED APPLICATION

This application is a 371 of international application of PCT application serial no. PCT/JP2017/015620, filed on Apr. 18, 2017, which claims the priority benefit of Japan application no. 2016-091223, filed on Apr. 28, 2016. The entirety of each of the abovementioned patent applications is hereby incorporated by reference herein and made a part of this specification.

BACKGROUND OF THE INVENTION

1. Field of the Invention

The present invention relates to a power source apparatus used for converting an input voltage from an external power source to a voltage that matches a device and then outputting the voltage, electronic equipment including the power source apparatus and a ship application execution system.

2. Description of Related Art

Currently, common electronic equipment is driven by a DC voltage. As an external power source for such electronic equipment, there is a DC power source or an AC power source. In addition, the power source voltage of the external power source may be the same as or different from the driving voltage of the electronic equipment at times. Therefore, it is imperative for the power source circuit to convert the input voltage from the external power source into a driving voltage that matches the device and then output the voltage.

Take a switching power source circuit described in Patent Document 1 as an example, the switching power source circuit supplies AC voltage to the primary side of the switching transformer (an insulating transformer), and then outputs the DC voltage from the secondary side of the switching transformer as a driving voltage. In addition, take a voltage generating apparatus described in Patent Document 2 as an example, the voltage generating apparatus supplies a DC voltage to the primary side of an insulating boost transformer, and then outputs a DC voltage from a secondary side of the boost transformer as a driving voltage.

As the external power source, there is a commercial power source as an example for the AC power source, and a battery for the DC power source. The battery can not only be used for electronic equipment with fixed installation locations but also easily used for electronic equipment where the installation location moves. Therefore, the battery is widely used as a power source for moving bodies such as automobiles and ships.

EXISTING TECHNICAL DOCUMENT

Patent Documents

Patent Document 1: Japanese Laid Open No. 2001-275344.

Patent Document 2: Japanese Laid Open No. 2015-23735.

SUMMARY OF THE INVENTION

Problems to be Solved by the Invention

In terms of the battery, if a material serving as the voltage generation source is reduced, the output voltage is reduced accordingly, and finally the DC voltage cannot be supplied any more. In this case, there is a concern about that the driving voltage cannot be output to the electronic equipment. Therefore, it becomes important to measure the output voltage of the battery for monitoring. In a case of a moving body, especially a ship, it is not easy to charge the battery or replace the battery, and therefore it becomes more important to measure the output voltage of the battery for monitoring.

However, in the conventional power source circuit including the switching power source circuit and the voltage generating apparatus, the voltage on the secondary-side of the insulating transformer is measured, and the voltage on the primary-side of the insulating transformer is not directly measured.

Therefore, the present invention is directed to provide a power source apparatus that can measure with ease an input voltage from an external power source and notify the user of the input voltage.

Means to Solve the Problem

The power source apparatus of the present invention includes a power source voltage input terminal, an insulating transformer, a microcomputer, and a communication unit. The power source voltage input terminal is connected to an external battery. A primary-side coil of the insulating transformer is connected to the power source voltage input terminal. The microcomputer is connected to the power source voltage input terminal and measures the input voltage to the power source voltage input terminal. The communication unit transmits the voltage value measured by a power source control device to the secondary side of the insulating transformer.

In this configuration, the power source control device is used to directly measure the primary-side voltage of the insulating transformer.

Effect of the Invention

According to the present invention, it is possible to measure with ease an input voltage from an external power source and notify the user of the input voltage.

DESCRIPTION OF THE EMBODIMENTS

Figure 1:
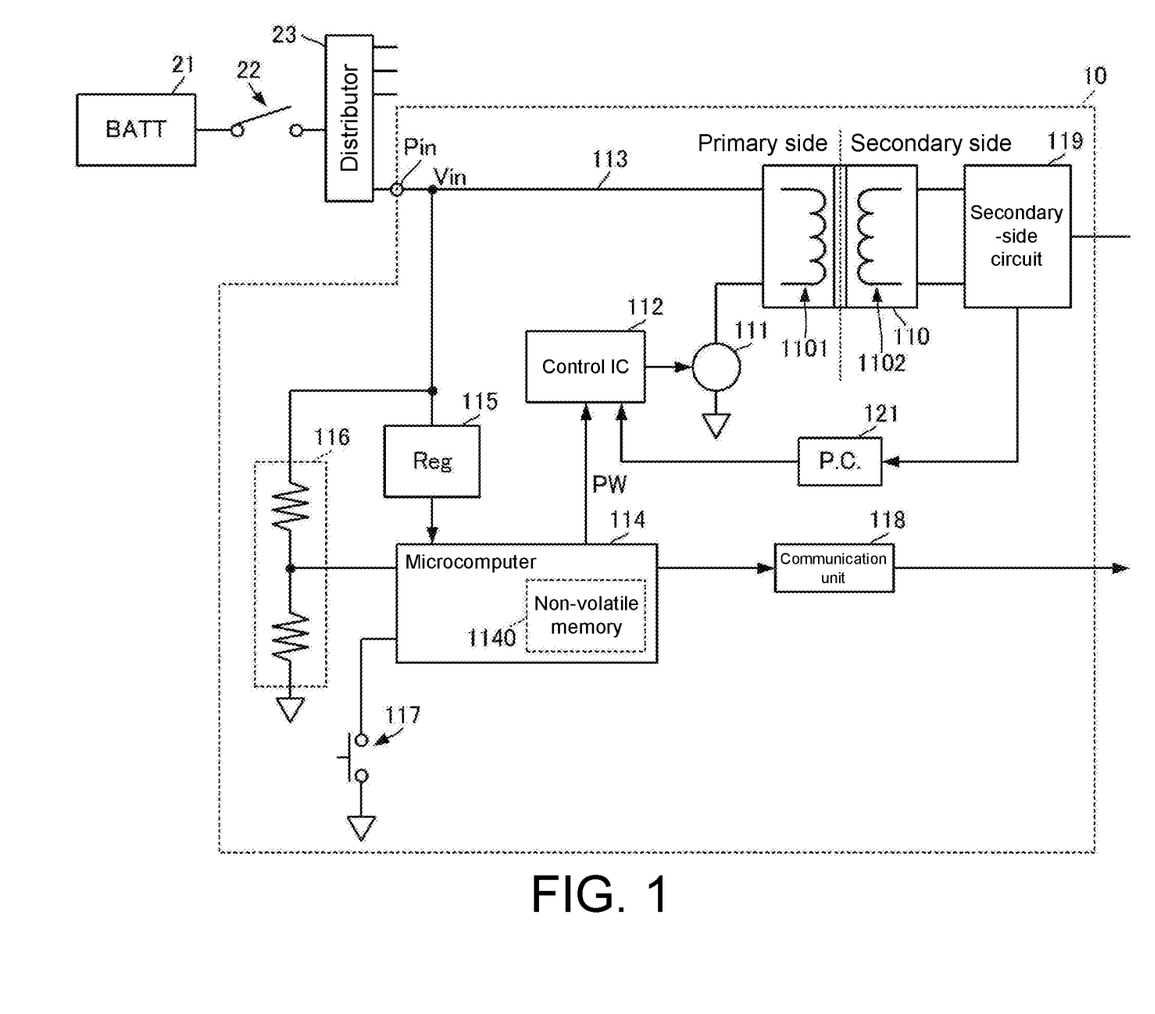
FIG. 1 is a functional block diagram of a power source apparatus according to a first embodiment of the present invention.

A power source apparatus and electronic equipment according to a first embodiment of the present invention will be described with reference to the drawings. FIG. 1 is a functional block diagram of a power source apparatus according to the first embodiment of the present invention.

As shown in FIG. 1, the power source apparatus 10 includes a power source voltage input terminal Pin, an insulating transformer 110, a switching element (which may also be referred to as a switch) 111, a control IC (which may also be referred to as controller) 112, a primary-side voltage supply line 113, a microcomputer (which may also be referred to as processing circuitry) 114, a regulator 115, a voltage distribution circuit 116, a power switch 117, a communication unit (which may also be referred to as a transmitter) 118, a secondary-side circuit 119, and a photo coupler 121. In addition, although an example using the microcomputer 114 is illustrated in the present embodiment, it is also possible to use devices such as Field Programmable Gate Array (FPGA) and Complex Programmable Logic Device (CPLD), etc. The microcomputer 114 and these devices correspond to the "power source control device" according to the present invention.

The power source voltage input terminal Pin is connected to a distributor 23 via a power cable. The distributor 23 is connected to the battery 21 via the breaker switch 22. In addition, though not shown in the drawings, the distributor 23 is connected to the power source apparatus of at least one electronic equipment that is different from the power source apparatus 10. The distributor 23 supplies the voltage of the battery 21 to a plurality of power source apparatuses connected to the distributor 23 respectively.

The insulating transformer 110 has a primary-side coil 1101 and a secondary-side coil 1102. The turns ratio of the primary-side coil 1101 to the secondary-side coil 1102 depends on the ratio of the voltage of the battery 21 to the output voltage of the power source apparatus 10.

A first end of the primary-side coil 1101 is connected to the power source voltage input terminal Pin via the voltage supply line 113. A second end of the primary-side coil 1101 is grounded via the switching element 111.

The secondary-side coil 1102 is connected to the secondary-side circuit 119. The secondary-side circuit 119 has a configuration of a secondary-side circuit of a common switching power source circuit using an insulating transformer 110. The description of the specific circuit configuration of the secondary-side circuit 119 is omitted. The secondary circuit 119 includes a secondary-side control unit (not shown). The secondary-side control unit detects the secondary-side voltage, that is, the output voltage of the power source apparatus 10, and generates a feedback signal to make the output voltage fixed.

The photo coupler 121 is connected to the secondary-side control unit of the secondary-side circuit 119 and the primary-side control IC 112. The photo coupler 121 transmits the feedback signal from the secondary-side control unit to the control IC 112.

The control IC 112 is connected to the switching element 111. The switching element 111 is turned on while an ON signal is received from the control IC 112; the switching element 111 is turned off during the period that the ON signal is not received from the control IC 112. In addition, the period during which the switching element 111 does not receive the ON signal from the control IC 112 may be either of a period during which the control IC 112 is activated and an OFF signal (a signal different from the ON signal in state) is received from the control IC 112, and a period during which the control IC 112 is not activated.

In addition, the control IC 112 controls the turn-off and turn-on of the switching element 111 based on the feedback signal. By adjusting the turn-off time and the turn-on time of the switching element 111 based on the feedback signal, it is possible to control the time for applying the voltage to the primary-side coil 1101 so as to adjust the current flowing to the primary-side coil 1101. By adjusting the current flowing to the primary-side coil 1101, it is possible to adjust the current flowing to the secondary-side coil 1102 so as to adjust the secondary-side voltage to a desired voltage value.

The microcomputer 114 is connected to the voltage supply line 113 via the regulator 115. The regulator 115 generates and outputs the driving voltage of the microcomputer 114 from the voltage of the voltage supply line 113. The driving voltage is supplied to the microcomputer 114, and accordingly the microcomputer 114 is driven by the driving voltage.

The microcomputer 114 is connected to the control IC 112, the voltage distribution circuit 116, the power switch 117, and the communication unit 118. The microcomputer 114 includes a voltage measurement terminal, an A/D conversion unit, and a non-volatile memory 1140 such as an EEPROM. In addition, the microcomputer 114 also includes other terminals and a computing unit, but these are omitted in the drawings and the description.

The microcomputer 114 executes a power-on control and a power-off control on the control IC 112. Specifically, the microcomputer 114 supplies the control IC 112 with a control IC driving voltage PW as the power-on control. On the other hand, the microcomputer 114 stops providing the control IC 112 with the control IC driving voltage PW as the power-off control. The control IC 112 operates while being supplied with the control IC driving voltage PW and executes the control of the above-described switching element 111.

Power state flags are stored in the non-volatile memory. The power state flags include a first power state flag and a second power state flag which are different from each other. The first power state flag corresponds to the power-on control on the control IC 112, and the second power state flag corresponds to the power-off control on the control IC 112. For example, the first power state flag is "H(1)", and the second power state flag is "L(0)".

The microcomputer 114 stores the first power state flag "H(1)" in the non-volatile memory 1140 when executing the power-on control on the control IC 112. The microcomputer 114 stores the second power state flag "L(0)" in the non-volatile memory 1140 when executing the power-off control on the control IC 112. By using the non-volatile memory 1140, even if a driving voltage is supplied to the microcomputer 114 or no driving voltage is supplied to the microcomputer 114, the state of the power state flag will remain unchanged as long as the state of the power state flag is not changed through updating.

The power switch 117 is, for example, a push type tact switch. The microcomputer 114 detects the depression of the power switch 117 so as to execute a power-on control or a power-off control on the control IC 112. Specifically, if the microcomputer 114 detects the depression of the power switch 117 in a state where the control IC 112 is not supplied with a control IC driving voltage PW, the microcomputer 114 executes a power-on control. If the microcomputer 114 detects the depression of the power switch 117 in a state where the control IC 112 is supplied with the control IC driving voltage PW, the microcomputer 114 executes a power-off control. In addition, the above-described power-on control and power-off control will be described in detail below.

The voltage distribution circuit 116 includes a plurality of resistors. The plurality of resistors (two resistors as shown in FIG. 1) is connected in series between the voltage supply line 113 and the ground potential. For example, take FIG. 1 as an example, the voltage distribution circuit 116 includes a first resistor and a second resistor connected in series. The connection point between the first resistor and the second resistor is connected to the voltage measurement terminal of the microcomputer 114.

The microcomputer 114 measures the input voltage Vin in the following way. The microcomputer 114 has an A/D (Analog/Digital) conversion terminal as a voltage measurement terminal. The microcomputer 114 converts the analog voltage applied to the voltage measurement terminal into a digital voltage value. That is, the microcomputer 114 converts the analog distribution voltage obtained by distributing the voltage of the voltage supply line 113 (the input voltage Vin of the power source voltage input terminal Pin) by means of the voltage distribution circuit 116 into the digital distribution voltage value.

The microcomputer 114 obtains the digital input voltage value corresponding to the input voltage Vin from the digital distribution voltage value. For example, the non-volatile memory of the microcomputer 114 stores a reference chart of the digital distribution voltage value and the digital input voltage value. Upon obtaining the digital distribution voltage value, the microcomputer 114 compares the digital distribution voltage value with the reference chart so as to obtain the digital input voltage value.

As a result, the power source apparatus 10 is capable of directly measuring the input voltage Vin of the power source apparatus 10 with a simple circuit configuration via the microcomputer 114 disposed on the primary side of the insulating transformer 110.

The microcomputer 114 outputs the digital input voltage value to the communication unit 118. The communication unit 118 transmits the digital input voltage value to the outside of the power source apparatus 10. As a result, the power source apparatus 10 can notify the user of the input voltage Vin of the power source apparatus 10 measured on the primary side of the insulating transformer 110. In addition, though not shown in the drawings, the power source apparatus 10 may be provided with a notification unit such as a display unit, so that the notification unit may notify the input voltage Vin.

In addition, the microcomputer 114 may intermittently obtain the digital input voltage value at specified time intervals. In this case, the communication unit 118 may transmit a plurality of digital input voltage values one by one, or may collectively transmit them by a specified number.

In addition, the microcomputer 114 of the power source apparatus 10 executes various power controls as shown below.

(Dealing with an Abnormal Voltage)

Figure 2:
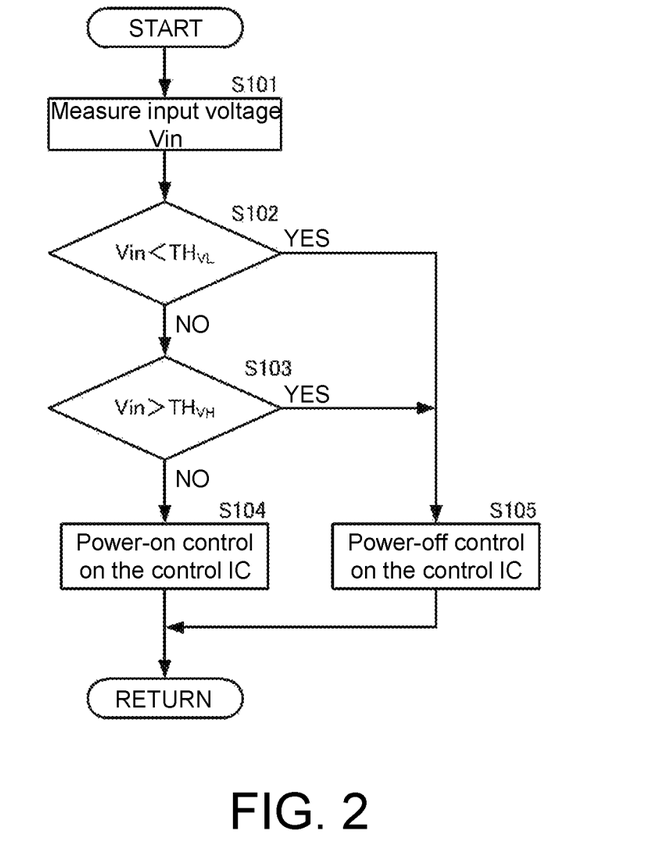
FIG. 2 is a flowchart for dealing with an abnormal voltage.

FIG. 2 is a flowchart for dealing with an abnormal voltage by a microcomputer of the power source apparatus according to a first embodiment of the present invention.

The microcomputer 114 measures the voltage of the voltage supply line 113, that is, the input voltage Vin (S101).

When the microcomputer 114 detects that the input voltage Vin is less than the lower threshold voltage $TH_{VL}$ (S102: YES), the microcomputer 114 executes a power-off control on the control IC 112 (S105). When the microcomputer 114 detects that the input voltage Vin is greater than the upper threshold voltage $TH_{VH}$ (S102: NO→S103: YES), the microcomputer 114 executes a power-off control on the control IC 112 (S105). In other words, as long as the input voltage Vin is not within the normal value range (the normal value range is greater than or equal to the lower threshold voltage $TH_{VL}$ and meanwhile equal to or less than the upper threshold voltage $TH_{VH}$), the microcomputer 114 executes the power-off control upon the control IC 112. In this case, the microcomputer 114 updates the power state flag FL from "H(1)" to "L(0)" and stores the "L(0)" in the non-volatile memory 1140.

When the microcomputer 114 detects that the input voltage Vin is greater than or equal to the lower threshold voltage $TH_{VL}$ (S102: NO) and meanwhile less than or equal to the upper threshold voltage $TH_{VH}$ (S103: NO), the microcomputer 114 executes a power-on control on the control IC 112 (S104).

By performing such processing, it is easy and reliable to achieve a low-voltage protection and an over-voltage protection for the power source apparatus 10, that is, it is possible to achieve dealing with the abnormal voltage. In this case, the input voltage Vin is directly measured by the microcomputer 114 disposed on the primary side of the insulating transformer 110, and then a determination concerning the low-voltage protection and the over-voltage protection can be performed by using the microcomputer 114, so that the circuit configuration of the low voltage protection and the overvoltage protection can be simplified.

(A Power-on Control)

Figure 3:
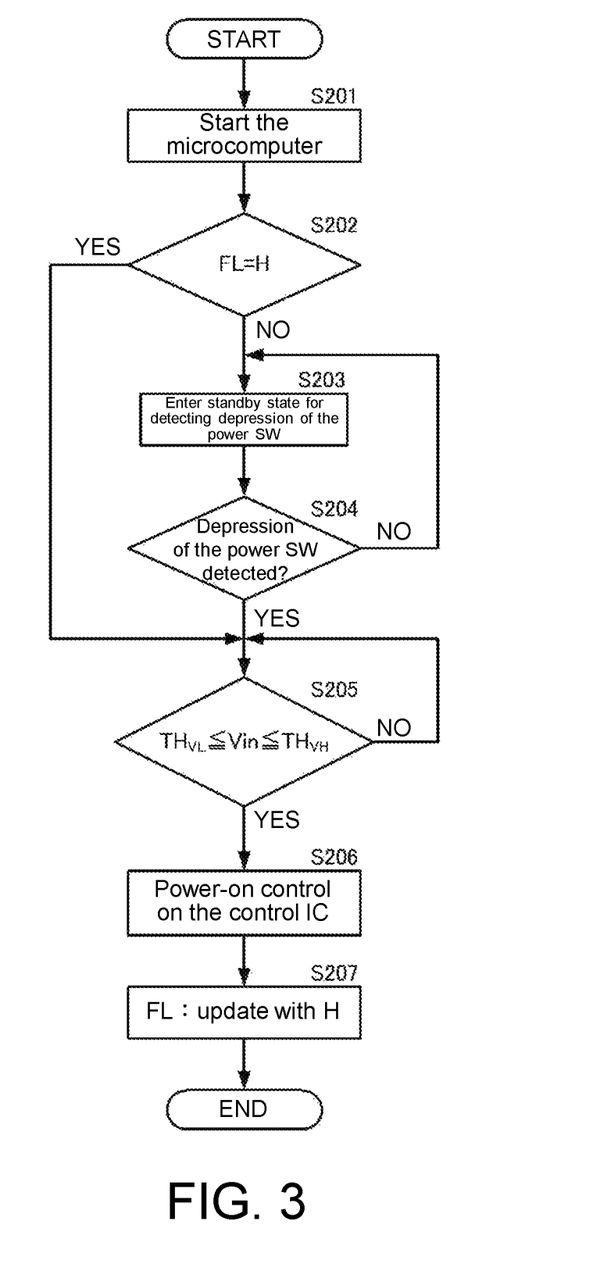
FIG. 3 is a flowchart for performing a power-on control on a control IC.

FIG. 3 is a flowchart for performing a power-on control on the control IC by a microcomputer of the power source apparatus according to a first embodiment of the present invention.

When the microcomputer 114 is supplied with the driving voltage via the voltage supply line 113, the microcomputer 114 is activated (S201). For example, in the case as shown in FIG. 1, if the breaker switch 22 is turned off, the input voltage Vin will not be supplied from the battery 21 to the power source voltage input terminal Pin. In this case, the microcomputer 114 is not supplied with the driving voltage. Therefore, the microcomputer 114 is not activated, and the power source apparatus 10 does not operate. In this state, if the breaker switch 22 is turned on, the input voltage Vin is supplied from the battery 21 to the power source voltage input terminal Pin, so that the microcomputer 114 is supplied with a driving voltage and accordingly activated.

When the microcomputer 114 reads the power state flag FL stored in the non-volatile memory 1140 and detects that the power state flag FL is "H(1)" (S202: YES), the microcomputer 114 shifts to detecting the state of the input voltage Vin.

When the microcomputer 114 detects that the power state flag FL is "L(0)" (S202: NO), the microcomputer 114 enters a standby state of detecting the depression of the power switch 117 (S203).

When the microcomputer 114 detects the depression of the power switch 117 (S204: YES), the microcomputer 114 shifts to detecting the state of the input voltage Vin. When the microcomputer 114 does not detect the depression of the power switch 117 (S204: NO), the microcomputer 114 maintains the standby state of detecting the depression of the power switch 117 (S203).

The microcomputer 114 measures the input voltage Vin upon shifting to detecting the state of the input voltage Vin. When the microcomputer 114 detects that the input voltage Vin is within a normal range (the normal value range is greater than or equal to the lower threshold voltage $TH_{VL}$ and meanwhile equal to or less than the upper threshold voltage $TH_{VH}$) (S205: YES), the microcomputer 114 executes a power-on control on the control IC 112 (S206), and updates the power state flag FL to "H(1)" (S207). In addition, when the microcomputer 114 detects that the input voltage Vin is not within the normal value range (S205: NO), the microcomputer 114 enters the standby state.

(A Power-Off Control)

Figure 4:
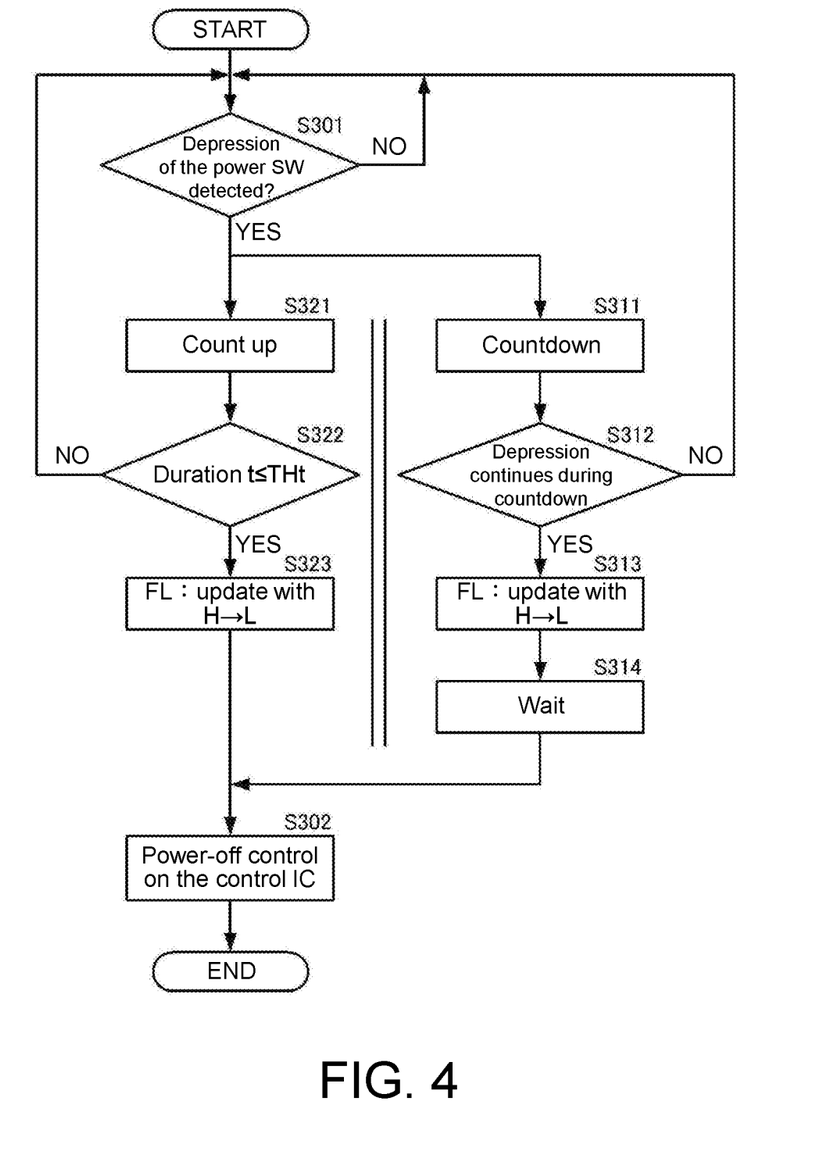
FIG. 4 is a flowchart for performing a power-off control on the control IC.

FIG. 4 is a flowchart for performing a power-off control on the control IC by a microcomputer of the power source apparatus according to a first embodiment of the present invention.

The microcomputer 114 maintains the power-on state of the power source apparatus 10 until detecting the depression of the power switch 117 (S301: NO).

When the microcomputer 114 detects the depression of the power switch 117 (S301: YES), the microcomputer 114 concurrently executes a normal stop operation and a forced stop operation.

(A Normal Stop Operation)

When the microcomputer 114 detects the depression of the power switch 117 (S301: YES), the microcomputer 114 executes a countdown operation (S311). The time set for the countdown operation is a time set for a normal stop operation of the power source apparatus 10.

When the microcomputer 114 detects that the depression is interrupted during the countdown operation (S312: NO), the microcomputer 114 maintains the power-on state of the power source apparatus 10, and enters the standby state of detecting the depression of the power switch 117.

When the microcomputer 114 detects that the depression continues during the countdown operation (the depression continues until the countdown operation ends) (S312: YES), the power state flag FL is updated from "H(1)" to "L(0)" (S313).

The microcomputer 114 executes a wait operation for a predetermined time (for example, about 10 seconds) (S314), and then stops supplying the control IC 112 with the control IC driving voltage. At this point, the microcomputer 114 has executed the normal stop operation of the power source apparatus 10.

(A Forced Stop Operation)

When the microcomputer 114 detects a depression of the power switch 117 (S301: YES), the microcomputer 114 counts up the duration t of the depression (S321). When the microcomputer 114 detects that the duration t is not less than or equal to the threshold time THt (S322: NO), the microcomputer 114 maintains the power-on state of the power source apparatus 10 and enters the standby state of detecting the depression of the power switch 117. The threshold time THt is a threshold time set for forcibly stopping the operation of the power source apparatus 10. The threshold time THt is longer than the time set in the countdown operation of the normal stop operation.

When the microcomputer 114 detects that the duration t is less than or equal to the threshold time THt (S322: YES), the microcomputer 114 updates the power state flag FL from "H(1)" to "L(0)" (S323).

The microcomputer 114 stops supplying the control IC 112 with the control IC driving voltage (S302). At this point, the microcomputer 114 has executed the forced stop operation of the power source apparatus 10.

By executing the processing as described above, the power source apparatus 10 can be normally stopped or forcibly stopped. In addition, although both the normal stop operation and the forced stop operation may be selected at the same time in the operation of the power-off control, actually it will work as long as either of the two operations is executed.

In addition, once the depression of the power switch 117 is detected, a power-off control is executed on the control IC 112 and the power state flag FL is updated to "L(0)". However, if the breaker switch 22 is turned off, the input voltage Vin will no longer be supplied, and the power-off control is no longer performed on the control IC 112, as a result, the power source apparatus 10 is forcibly stopped. Therefore, in this case, the power state flag FL is maintained at the state of "H(1)".

Thus, the microcomputer 114 can recognize that the user stops the operation of the power source apparatus 10 by using the power switch 117 alone, or the user forcibly terminates the power supply to the power source apparatus 10 by turns off the breaker switch 22, and can store the recognition result in advance to the non-volatile memory 1140.

The microcomputer 114 adopts the power state flag for the power-on control.

By using the power-on control and the power-off control, the microcomputer 114 can perform a power-on control on the control IC 112 according to the previous power-off state of the power source apparatus 10. Specifically, when the user stops the operation of the power source apparatus 10 by turning off the power switch 117 alone, the microcomputer 114 does not supply the control IC 112 with the control IC driving voltage until the depression of the power switch 117 is detected. On the other hand, when the user forcibly terminates the supply of the input voltage Vin to the power source apparatus 10 by turning off the breaker switch 22, the microcomputer 114 will supply the control IC 112 with the control IC driving voltage if the input voltage Vin falls within the normal voltage value range without detecting the depression of the power switch 117.

Accordingly, if the user has performed the power-off control on the power source apparatus 10 at will last time, even if the breaker switch 22 is turned on, the power-on control of the power source apparatus 10 will not be activated if the power switch 117 is not pressed. On the other hand, if the user does not perform the power-off control on the power source apparatus 10 but turns off the breaker switch 22 last time, the power-on control of the power source apparatus 10 will be activated as long as the breaker switch 22 is turned on. Therefore, it is possible to achieve the power-on control that reflects the user's intention to perform the power-off last time.

Figure 5:
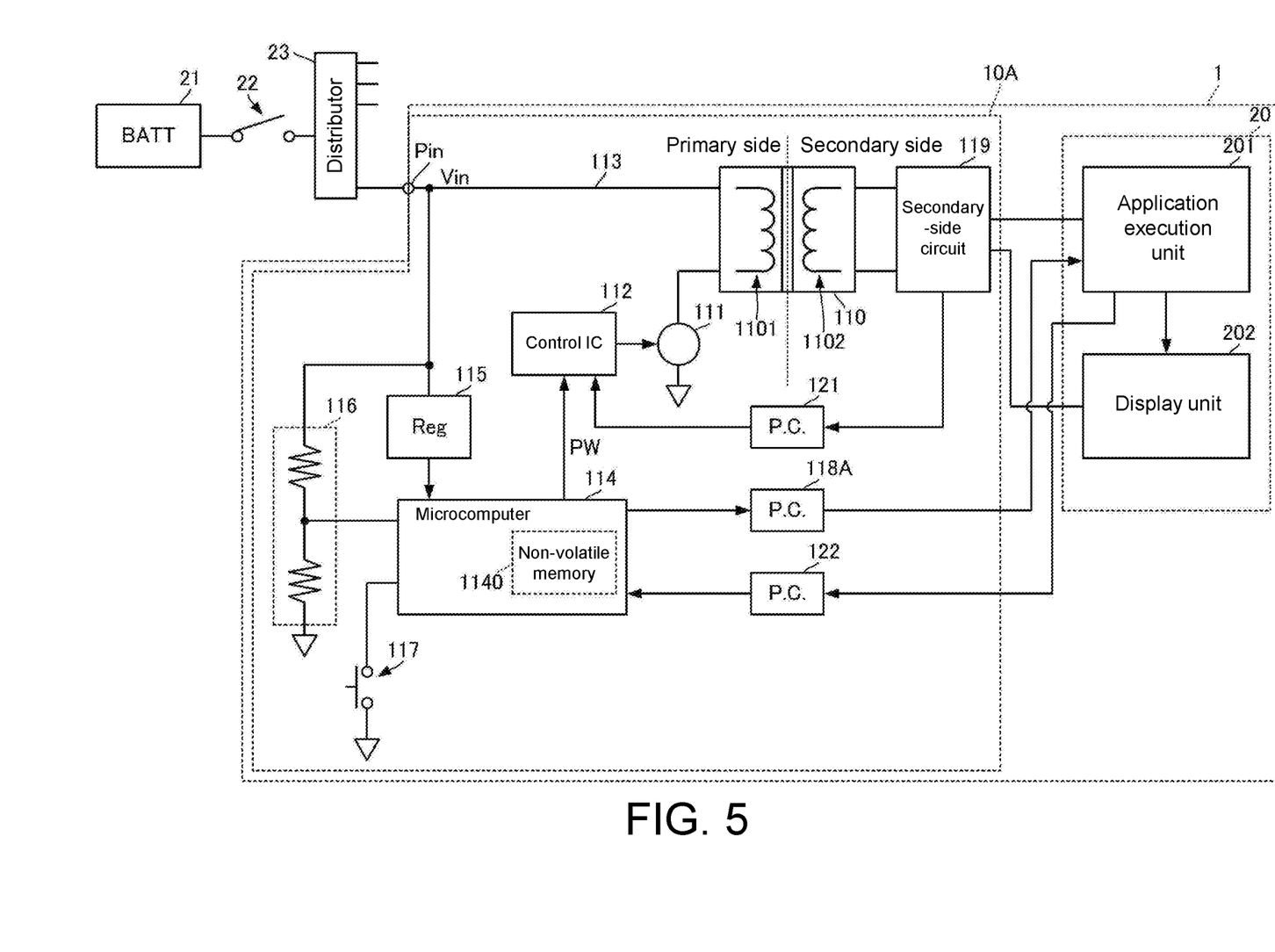
FIG. 5 is a functional block diagram of electronic equipment according to a second embodiment of the present invention.

Next, electronic equipment according to a second embodiment of the present invention will be described with reference to the drawings. FIG. 5 is a functional block diagram of electronic equipment according to a second embodiment of the present invention.

As shown in FIG. 5, the electronic equipment 1 according to the present embodiment includes a power source apparatus 10A and a function unit 20. The power source apparatus 10A differs from the power source apparatus 10 according to the first embodiment in that the communication unit 118 is replaced with a combination of a photo coupler 118A and a photo coupler 122. The other configurations of the power source apparatus 10A are the same as those of the power source apparatus 10 according to the first embodiment, and therefore the description of the same parts will be omitted.

The function unit 20 includes an application execution unit (which may also be referred to as an application processor) 201 and a display unit (which may also be referred to as a display) 202. The application execution unit 201 and the display unit 202 are connected to the secondary-side circuit 119. That is, the function unit 20 is connected to the secondary side of the power source apparatus 10A. The application execution unit 201 and the display unit 202 are supplied with the driving voltage from the secondary-side circuit 119. The application execution unit 201 is connected with the display unit 202.

The application execution unit 201 includes a CPU and a storage medium storing an application program. The application execution unit 201 reads and executes an application program from the storage medium by the CPU, thereby executing various applications to be executed in the electronic equipment 1. For example, when the electronic equipment 1 is a navigation device, the application execution unit 201 executes various ship applications related to ship navigation. In this case, as a specific application, there are applications such as an application that generates a navigation position and a navigation track by GPS positioning, an application that generates fishery production support information, and the like. The application execution unit 201 outputs the execution result of the application to the display unit 202. In addition, the application execution unit 201 transmits various control signals to the microcomputer 114 via the photo coupler 122.

The display unit 202 is, for example, a liquid crystal display that displays the execution result of the application.

The photo coupler 118A of the power source apparatus 10A outputs the digital input voltage value output from the microcomputer 114 to the application execution unit 201. The application execution unit 201 enables the digital input voltage value to be displayed on the display unit 202. In this case, the application execution unit 201 may display the digital input voltage value together with the execution result of the application.

By displaying the digital input voltage value on the display unit 202 as described above, it is easy and reliable for the user to check the voltage value of the input voltage Vin, and so as to estimate the residual capacity of the battery 21.

In particular, when the electronic equipment 1 is a navigation device and the electronic equipment 1 and the battery 21 are mounted on the hull, since the battery 21 cannot be easily replaced, there is a concern about that the power of the battery 21 is depleted at sea and the electronic equipment 1 cannot be used any longer. However, by providing such a configuration, the user can reliably and easily check the input voltage, and so that the situation in which the electronic equipment 1 cannot be used can be reliably avoided.

In addition, in the case where a digital input voltage value is obtained intermittently at specified time intervals as described above, and thus a plurality of times of digital input voltage values is obtained, the application execution unit 201 may output transition states of a plurality of times of digital input voltage values as a graph or the like based on the plurality of digital input voltage values, and display the graph on the display unit 20. In addition, the application execution unit 201 may estimate the remaining time when the battery 21 will be exhausted based on the transition states of the plurality of times of digital input voltage values, and display the remaining time on the display unit 202. In this case, sine the digital input voltage value is measured by the primary-side microcomputer 114, it is possible to obtain the remaining time corresponding to the condition of the battery 21 quickly.

In addition, when the electronic equipment 1 is a navigation device, the "ship application execution system" of the present invention can be realized by the electronic equipment 1, the battery 21, and the breaker switch 22. In addition, when the electronic equipment 1 is a navigation device and comprises a plurality of electronic equipments 1 and each electronic equipment 1 executes a different application, the "ship application execution system" of the present invention can be realized by the plurality of electronic equipments 1, the battery 21, the breaker switch 22 and the distributor 23. Moreover, in this case, the plurality of electronic equipments are is connected to the breaker switch 22 via the distributor 23, respectively.

In this case, the plurality of electronic equipments 1 may be forcibly stopped by switching off the breaker switch 22. In this situation, the plurality of electronic equipments 1 will be again powered on at the same time when the breaker switch 22 is turned on. However, by using the power-on control and the power-off control, it is possible to select to activate each of the plurality of electronic equipments 1 by pressing the power switch 117 or forcibly (automatically) activate each of the plurality of electronic equipment by energization. Therefore, it is possible for the user to execute the power-on control on the plurality of electronic equipments 1 based on the previous power-off state.

In addition, the normal shutdown processing of the power-off control described in the first embodiment may be executed by the application execution unit 201 of the electronic equipment 1 in the present embodiment connected with the secondary side of the insulating transformer 110. In this case, the application execution unit 201 receives the detection signal of the depression of the power switch 117 from the microcomputer 114 via the photo coupler 118A. The application execution unit 201 executes the processing of steps S311 and S312 described above. When the result of step S312 is YES, as a processing corresponding to step S313, the application execution unit 201 generates a control signal for updating the power supply state flag FL from "H(1)" to "L(0)", and transmits it to the microcomputer 114 via the photo coupler 122. After executing the wait processing in step S314, the microcomputer 114 executes the power-off control of the control IC 112 (S302).

Figure 6:
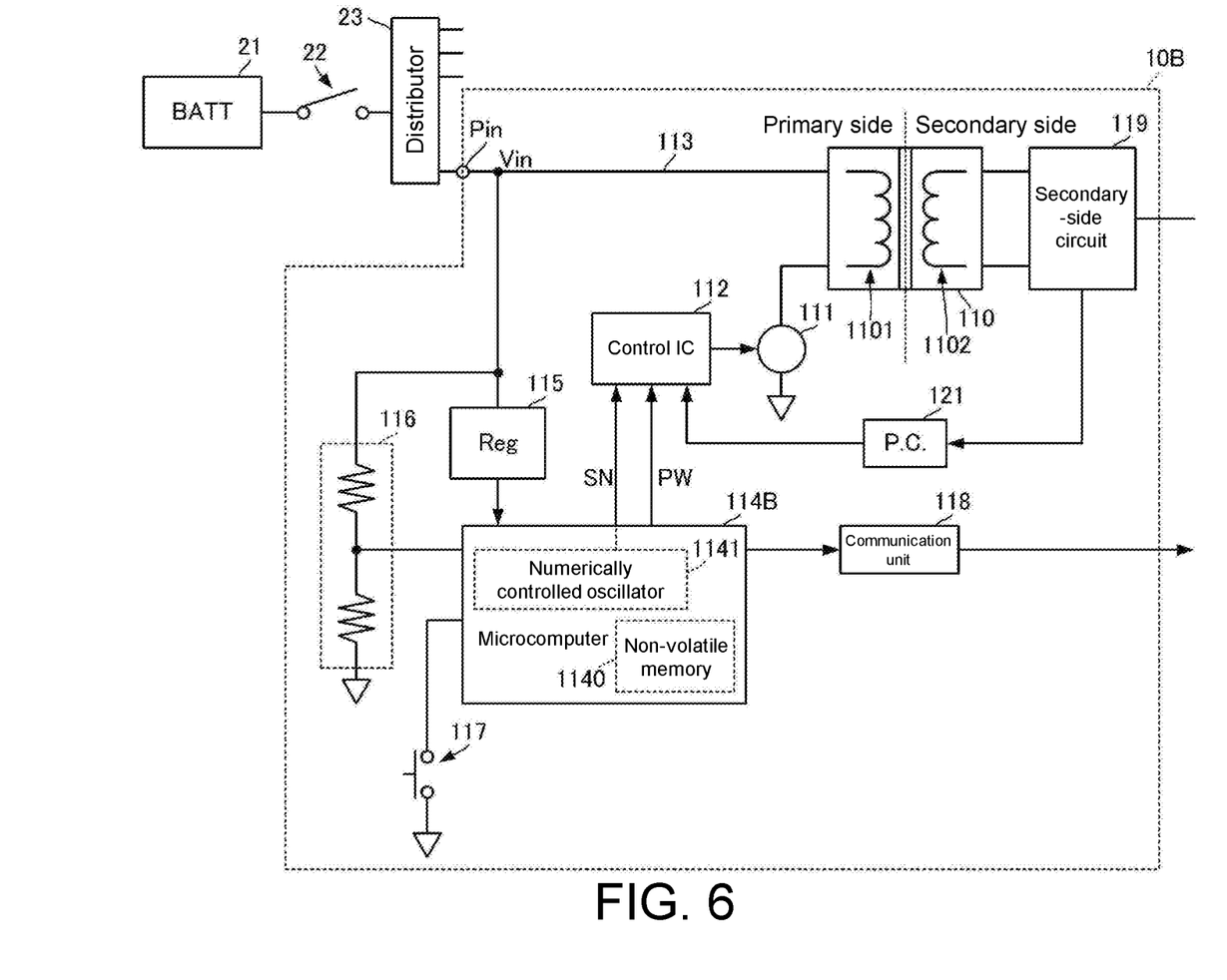
FIG. 6 is a functional block diagram of a power source apparatus according to a third embodiment of the present invention.

Next, a power source apparatus according to a third embodiment of the present invention will be described with reference to the drawings. FIG. 6 is a functional block diagram of a power source apparatus according to the third embodiment of the present invention.

The power source apparatus 10B according to the present embodiment is different from the power source apparatus 10 according to the first embodiment in that the clock frequency control over the control IC 112 by the microcomputer 114B is increased.

The microcomputer 114B includes a numerically controlled oscillator (NCO) 1141. The microcomputer 114B generates a clock control signal SN of the control IC 112 by using the numerically controlled oscillator 1141 and outputs the same to the control IC 112. The control IC 112 executes the switching of the switching element 111 in synchronization with the clock control signal SN.

By using such a configuration, the control IC 112 can reliably execute the switching control of the switching element 111 even if the control IC 112 does not include a dedicated clock oscillator. As a result, the circuit scale of the power source apparatus 10B can be reduced.

In addition, since the clock frequency accuracy of the microcomputer 114B is relatively high, a high-precision clock frequency can be set for the control IC 112. As a result, the power source apparatus 10B can control the secondary-side voltage with high accuracy.

In this case, by using a numerically controlled oscillator, an accurate clock frequency can be set for the control IC 112 even if the clock frequency of the microcomputer 114B and the clock frequency of the control IC 112 are not in integer multiples.

In addition, in the embodiments described above, the battery 21 is used as the external power source of the power source apparatus and the electronic equipment. However, in fact, as long as the power source of the voltage generation source is consumed over time, it can replace the battery 21.

What is claimed is:

1. A power source apparatus, comprising:
a power source voltage input terminal connected to an external battery;
an insulating transformer, comprising a primary-side coil connected to the power source voltage input terminal;
processing circuitry connected to the power source voltage input terminal, and the processing circuitry being configured to measure an input voltage to the power source voltage input terminal;
a power switch connected to the processing circuitry;
a transmitter configured to transmit a voltage value measured by the processing circuitry to a secondary side of the insulating transformer;
a switch, configured to control a time for applying a voltage to the primary-side coil; and
a controller configured to control the switch, wherein
the processing circuitry is further configured to perform a power-off control on the controller when the voltage value is not within a given range, and wherein
the processing circuitry comprises a non-volatile memory for storing a first power state flag or a second power state flag, wherein the first power state flag corresponds to a power-on control on the controller, and the second power state flag corresponds to the power-off control on the controller;
when the processing circuitry is activated by the input voltage and detects the first power state flag from the non-volatile memory, the processing circuitry executes the power-on control on the controller,
when the processing circuitry is activated by the input voltage and detects the second power state flag from the non-volatile memory, the processing circuitry enters a standby state for detecting a press of the power switch, and
when the press of the power switch is detected in the standby state, the processing circuitry executes the power-on control on the controller.

2. The power source apparatus according to claim 1, wherein
the processing circuitry comprises a numerically controlled oscillator for generating a clock control signal of the controller, and
the controller controls the switch based on the clock control signal.

3. An electronic equipment, comprising:
the power source apparatus according to claim 1;
a secondary-side circuit connected to a secondary-side coil of the insulating transformer;
an application processor supplied with an electric power from the secondary-side circuit; and
a display connected to the application processor; and
the application processor receives the voltage value from the transmitter and displays the voltage value on the display.

4. The electronic equipment according to claim 3, wherein
the application processor executes an application for ships.

5. A ship application execution system, comprising:
a plurality of the electronic equipment according to claim 4;
a battery;
a breaker switch connected to the battery; and
a distributor connected between the breaker switch and the plurality of electronic equipment, and the distributor being configured to distribute a voltage of the battery to the plurality of electronic equipment.

6. The power source apparatus according to claim 1, wherein
the processing circuitry comprises a numerically controlled oscillator for generating a clock control signal of the controller, and
the controller controls the switch based on the clock control signal.

7. The power source apparatus according to claim 1, wherein
the processing circuitry comprises a numerically controlled oscillator for generating a clock control signal of the controller, and
the controller controls the switch based on the clock control signal.

8. The power source apparatus according to claim 1, wherein
the processing circuitry comprises a non-volatile memory for storing a first power state flag or a second power state flag, wherein the first power state flag corresponds to a power-on control on the controller, and the second power state flag corresponds to a power-off control on the controller; and
when the processing circuitry is activated by the input voltage and detects the first power state flag from the non-volatile memory, the processing circuitry executes the power-on control on the controller.

9. An electronic equipment, comprising:
the power source apparatus according to claim 1;
a secondary-side circuit connected to a secondary-side coil of the insulating transformer;
an application processor supplied with an electric power from the secondary-side circuit; and
a display connected to the application processor; and
the application processor receives the voltage value from the transmitter and displays the voltage value on the display.

* * * * *